United States Patent

Park et al.

[11] Patent Number: 5,575,000
[45] Date of Patent: Nov. 12, 1996

[54] AUTOMATIC BROADCASTING CHANNEL SETTING SYSTEM AND THE METHOD THEREOF

[75] Inventors: Ki B. Park; Young C. Kim, both of Seoul, Rep. of Korea

[73] Assignee: Goldstar Co., Ltd., Seoul, Rep. of Korea

[21] Appl. No.: 160,671

[22] Filed: Dec. 2, 1993

[30] Foreign Application Priority Data

Dec. 2, 1992 [KR] Rep. of Korea ................. 92-23129
Dec. 8, 1992 [KR] Rep. of Korea ................. 92-23602

[51] Int. Cl.[6] ................................. H04B 1/18
[52] U.S. Cl. ......................... 455/186.2; 455/183.2; 455/182.2; 348/732; 360/69; 386/46
[58] Field of Search ................. 455/186.1, 186.2, 455/185.1, 182.2, 183.2, 151.1, 182.1, 182.2, 4.2, 6.2, 6.1, 6.3; 348/732, 731, 906, 460; 358/335; 360/33.1, 69; H04N 5/44

[56] References Cited

U.S. PATENT DOCUMENTS

| | | | |
|---|---|---|---|
| 4,763,195 | 8/1988 | Tults | 348/732 |
| 5,034,820 | 7/1991 | Cho | 348/731 X |
| 5,307,173 | 4/1994 | Yuen et al. | 455/186.1 X |
| 5,393,713 | 2/1995 | Schwob | 455/186.1 X |
| 5,450,135 | 9/1995 | Schick | 348/732 X |

FOREIGN PATENT DOCUMENTS

| | | |
|---|---|---|
| 2256333 | 12/1992 | United Kingdom . |
| 2256546 | 12/1992 | United Kingdom . |
| 2256548 | 12/1992 | United Kingdom . |
| 2256549 | 12/1992 | United Kingdom . |
| 2266818 | 11/1993 | United Kingdom . |

Primary Examiner—Reinhard J. Eisenzopf
Assistant Examiner—Philip J. Sobutka
Attorney, Agent, or Firm—Jacobson, Price, Holman & Stern, PLLC

[57] ABSTRACT

An automatic broadcasting channel setting system and the method thereof for setting automatically a G-code channel, which is different according to respective districts, to a plus channel. Using G-code channel data according to respective districts which is provided as a data base, a G-code channel having the best receiving sensibility is set among the broadcasting channels being received, and the set G-code channel is set, or mapped, to a plus channel. According to an embodiment of the present invention, the automatically set channel data is backed-up to and stored in a separate device, and used in automatic channel setting of another image device in which channel setting is not performed.

7 Claims, 5 Drawing Sheets

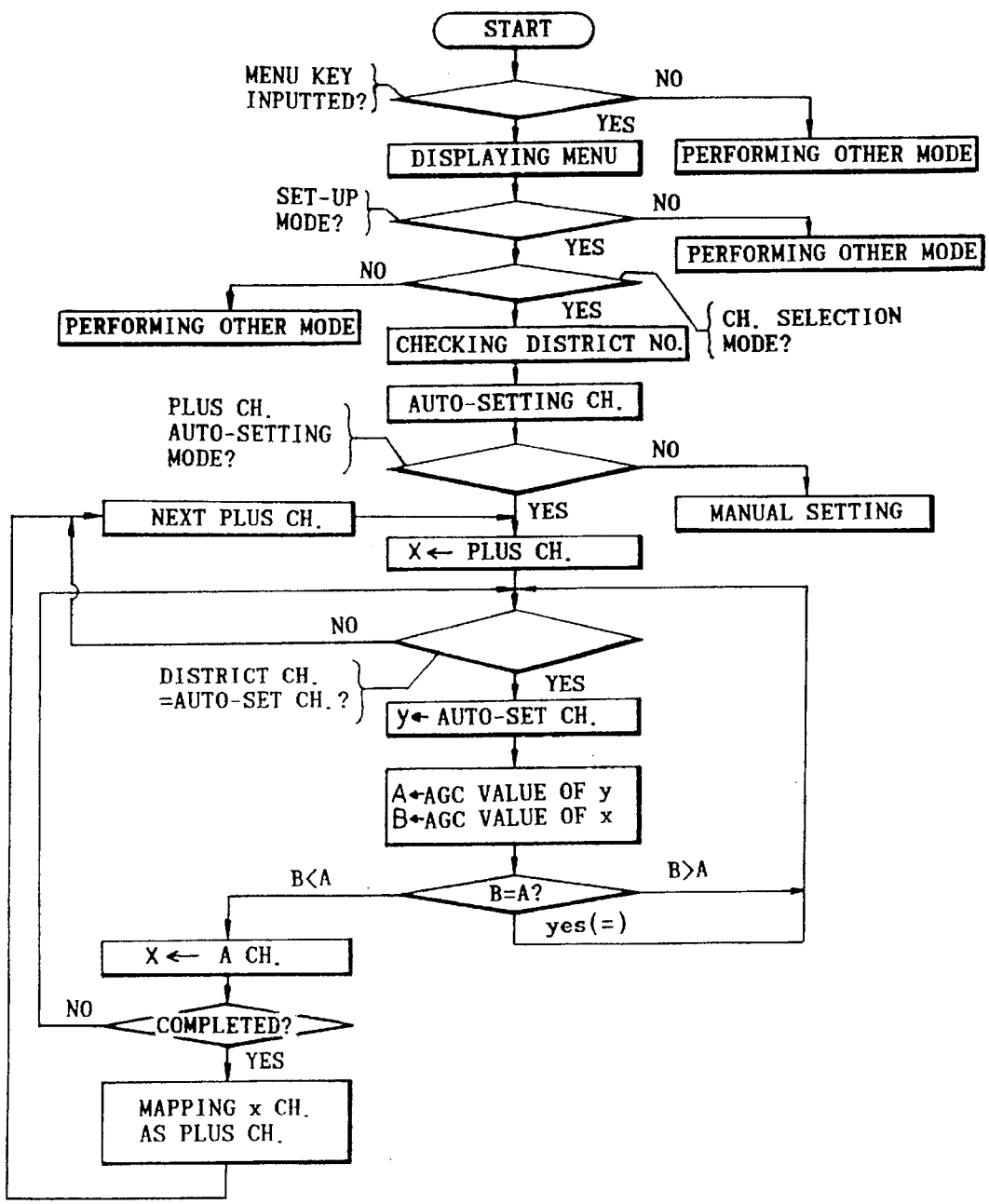

FIG. 6A
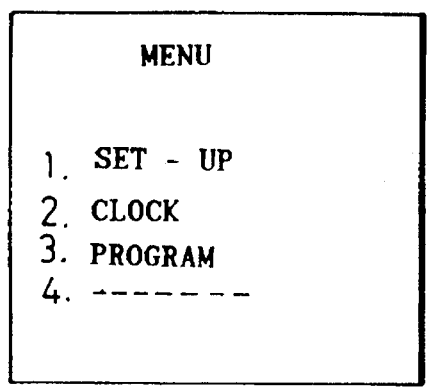
FIG. 6B
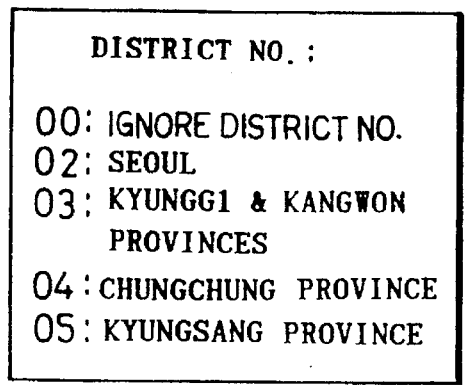
FIG. 7
| BROADCASTING STATION | SEOUL | PUSAN | - - - - - | PLUS CHANNEL |
|---|---|---|---|---|
| KBS 1 | 05. 09. 32 | 05. 07. 09 | - - - | 09 |
| KBS 2 | 07. 43 | 36. 43 | - - - | 07 |
| KBS 3 | 13. 28 | 13. 32 | - - - | 13 |
| MBC | 11. 47 | 10. 46 | - - - | 11 |
FIG. 8
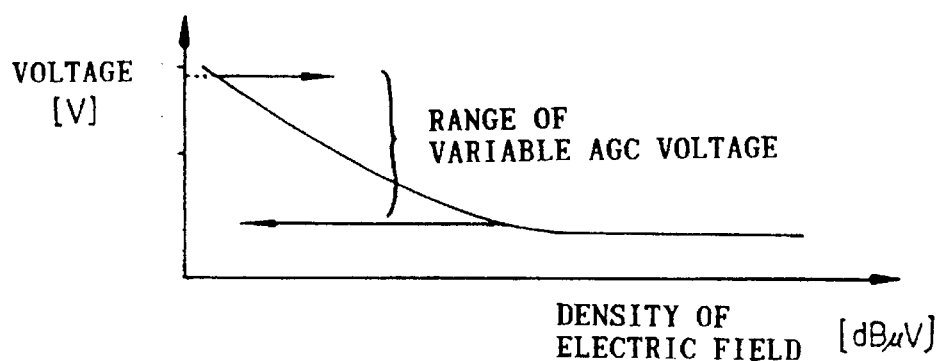

AUTOMATIC BROADCASTING CHANNEL SETTING SYSTEM AND THE METHOD THEREOF

BACKGROUND OF THE INVENTION

1. Field of the Invention

The present invention relates to an automatic broadcasting channel setting system for a video cassette recorder (VCR), a television, etc. and the method thereof, and more particularly to an automatic broadcasting channel setting system and the method thereof which can automatically set a broadcasting channel, which is different according to respective districts, to a plus channel (e.g., a G-code channel), thereby providing convenience in using a VCR or a television.

2. Prior Art

In a conventional broadcasting channel setting system, it is necessary to map a broadcasting channel, which is different according to respective districts, to a plus channel (e.g., a G-code channel) by manual handling of timer pre-recording using the G-code. That is, a user must set a presently broadcasting channel of the concerned district in comparison with the plus channel in a guidebook confirming each channel one by one.

FIG. 1 shows a construction of a conventional channel setting system, which comprises a remote controller 1 and a key input section 3 for entering a key signal to set a G-code channel to a VCR set, a microprocessor 2 controlling G-code setting according to the key signal from the remote controller 1 and a key input section 3, a memory (EEP ROM) 4 for storing G-code channel data set by the microprocessor 2, and an On-Screen Display (OSD) 5 for displaying the G-code channel data stored in the memory 4 on a screen.

In a conventional system having the construction as described above, a user must set broadcasting channels presently inputted by the remote controller 1 or the key input section 4 to channels in a guidebook channels one by one, so that the channel setting work is difficult and annoying. Especially, in case that a user wishes to make a timer pre-recording of a television program by making use of a G-code, it is difficult to match a real channel with a plus channel.

A G-code itself is merely a number. However, it indicates the channel(s), start time and end time of a television program. The channel information of the G-code is the channel of a main district. Accordingly, an alien to that district cannot make a timer pre-recording by making use of the G-code without channel matching. It is difficult and annoying to match and set channels in the conventional system.

SUMMARY OF THE INVENTION

The object of the present invention is to provide an automatic broadcasting channel setting system and the method thereof to set automatically a channel of the concerned district to a plus channel, which may be a G-code channel.

Another object of the present invention is to provide an automatic broadcasting channel setting system and the method thereof to automatically search a channel presenting the best reception quality among the several broadcasting channels and to set it to a plus channel.

To achieve above objects of the present invention, the present invention provides an automatic broadcasting channel setting system comprising:

a first key input means for inputting a key signal for automatic G-code channel setting.

a first microprocessor for searching and setting a channel in a concerned district among the received channels according to the automatic channel setting key signal inputted from said first key input means, and for performing a controlling function to set said set channel to a plus channel; and a first memory means for storing channel data set by said microprocessor, and for outputting said stored channel data under the control of said first microprocessor.

The present invention also provides an automatic broadcasting channel setting system comprising the steps of:

selecting an automatic channel setting mode;

searching and setting a channel among the received broadcasting channels in the concerned district which is presenting the best reception quality among the several broadcasting channels when an automatic channel setting mode is selected; and setting said searched and set channel to a plus channel.

BRIEF DESCRIPTION OF THE DRAWINGS

The above objects and other features and advantages of the present invention will become more apparent by describing the preferred embodiments there of with reference to the accompanying drawings, in which:

FIG. 5 is a flow chart showing the algorithm of an automatic broadcasting channel setting method according to another embodiment of the present invention.

FIG. 6A and B show examples of selecting menu display states according to the present invention.

FIG. 7 shows an example of table of broadcasting channels according to respective districts being stored for automatic channel setting according to the present invention.

FIG. 8 is a graph showing the range of variable AGC voltage applied to a received broadcasting channel signal.

DETAILED DESCRIPTION OF THE EMBODIMENTS

Figure 1:
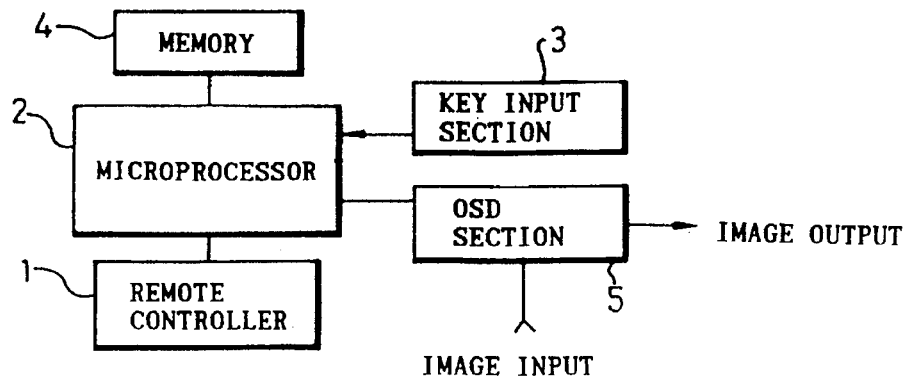
FIG. 1 is a block diagram showing the construction of a conventional G-code channel setting system.
Figure 2:
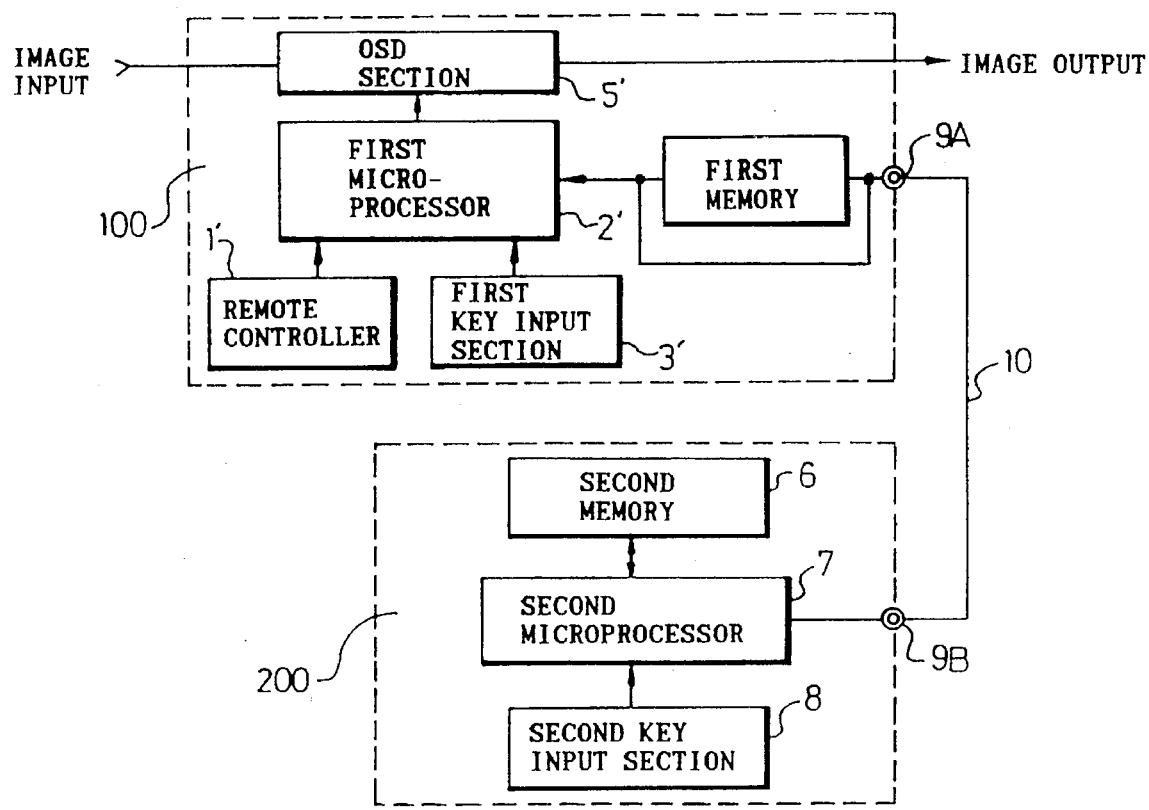
FIG. 2 is a block diagram showing the construction of an automatic broadcasting channel setting system according to an embodiment of the present invention.
Figure 3:
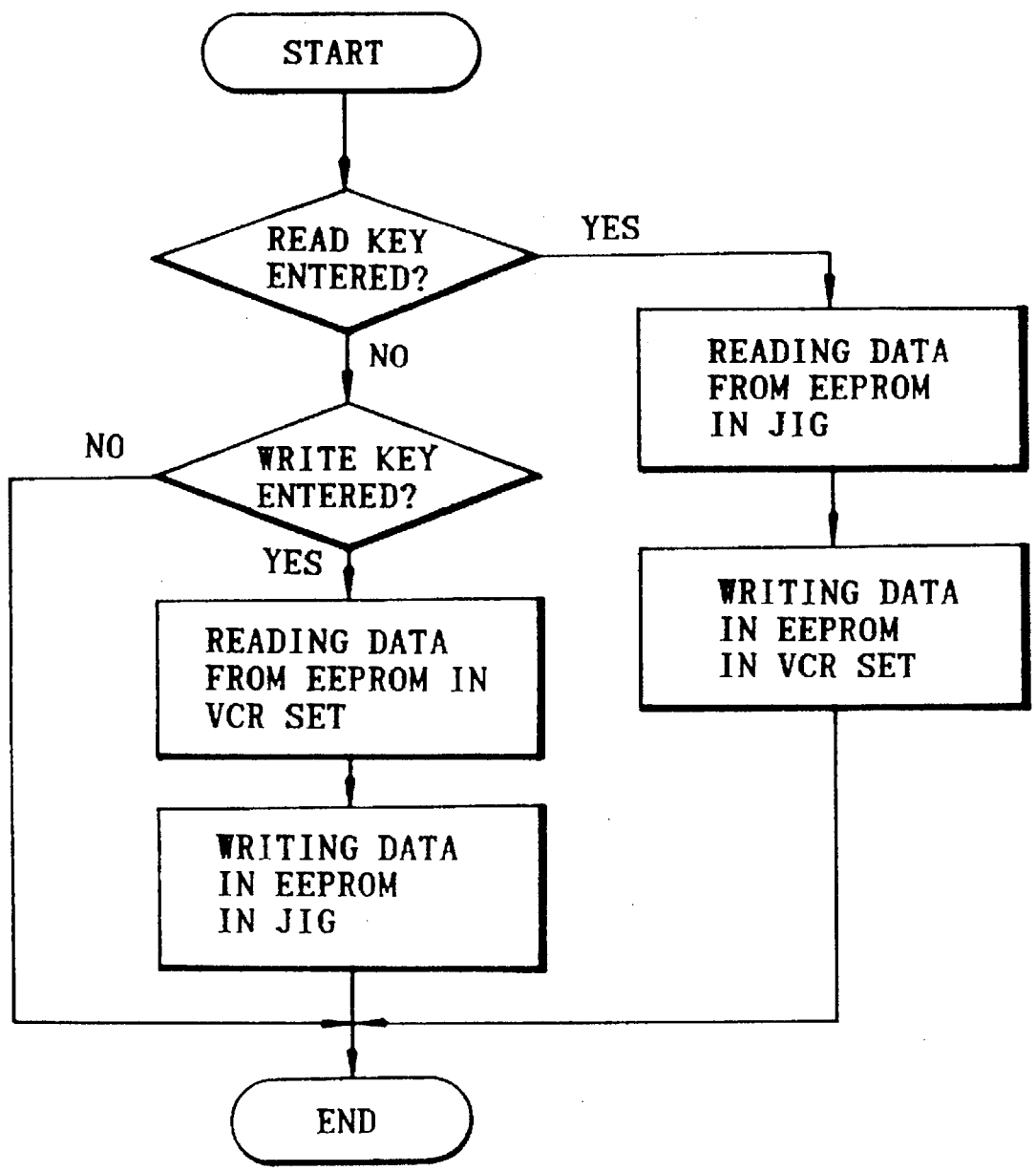
FIG. 3 is a flow chart showing the algorithm of an automatic broadcasting channel setting method according to another embodiment of the present invention.

Referring to FIG. 2, an automatic channel setting system according to one embodiment of the present invention comprises a VCR set 100 for setting channel for reserving a G-code channel, and a zig set 200 connected to said VCR set 100 for storing G-code channel data set in and backed-up from said VCR set 100 and for outputting said stored G-code channel data to the VCR set 100.

The VCR set 100 comprises a first key input section 3' and a remote controller 1' for inputting signal setting G-code channels, a first microprocessor 2' controlling G-code setting function according to the key signal from the remote controller 1' and the first key input section 3', a first memory 4' for storing G-code channel data outputted from zig set 200 or for storing G-code channel data set by the first microprocessor, and an OSD section for displaying G-code channel data stored in the first memory on a screen.

Meanwhile, the zig set 200 comprises a second memory 6 for storing and outputting data set in and backed-up from the VCR set 100, a second microprocessor 7 for storing the data of the second memory 6 and the output thereof, and a second key signal input section for inputting the key signal for controlling the acting of the second microprocessor.

Meanwhile, between the first memory 4' of the VCR set 100 and the second microprocessor 7 of the zig set 200, jacks for inputting and outputting G-code channel data are provided and interconnected with each other through an electric wire 10.

According to another embodiment of the present invention, the second micro processor 7 and the second key input section 8 of the zig set 200 can be replaced by the first microprocessor 2' and the first key input section 3' of the VCR set 100. A G-code channel setting method by the system having the construction described above according to the present invention will be described hereinafter referring to FIG. 4.

First, a producer or a sales man inputs a G-code channel of the concerned district into the first microprocessor 2' by the remote controller 1' or the first key input section 3' of the VCR set 100, and the G-code channel data set by the first microprocessor 2' are stored in the first memory 4'.

Meanwhile, if a write key in the second key input section 8 of the zig set 200 is inputted under the state that the jack 9A of the VCR set 100 is connected to the jack 9B of the zig set 200, the G-code channel data stored in the first memory 4' of the VCR set 100 are backed-up to and stored in the second memory 6 under the control of the second microprocessor 7. After the G-code channel data have been stored in the second memory 6 as described above, if the zig set 200 is connected to another VCR set in which no G-code channel is set and a read key in the second key input section 8 of the zig set 200 is inputted, the G-code channel data stored in the second memory 6 are stored in the memory in the VCR set under the control of the second microprocessor 7, thereby a G-code channel is automatically set.

By above-described method, G-code channel data can be repeatedly stored in a plurality of VCR sets in which no G-code channel is set.

Figure 4:
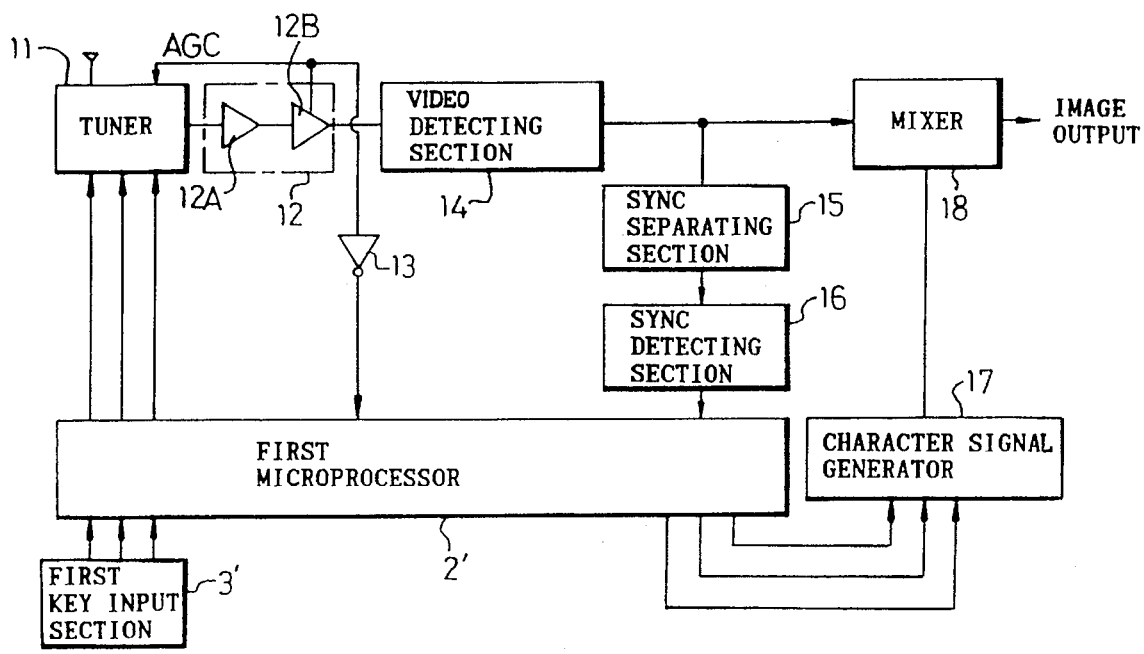
FIG. 4 is a block diagram showing the construction of an automatic broadcasting channel setting system according to another embodiment of the present invention.

FIG. 4 shows the construction of an automatic channel setting system according to another embodiment of the present invention. Referring to FIG. 4, said system comprises a key input section 3" for inputting a key signal for automatic channel setting, a microprocessor 2" for setting a channel having the best reception quality among channels of the concerned district for a G-code channel and for controlling the mapping of said channel to a plus channel, a tuner 11 for selecting a channel of the received broadcasting signal under the control of said microprocessor 2", an amplifying section 12 for amplifying the broadcasting signal of the selected channel, and an inverter 6 for signal inverting the automatic gain control (AGC) voltage outputted from said amplifying section 12 and for providing it to the microprocessor 2" for the broadcasting reception quality information of the presently selected channel. Said system also comprises a video detecting section 14 for detecting the video signal from said amplified signal, a sync separating section 15 separating a synchronizing signal from the detected video signal, a sync detecting section 9 for detecting the separated synchronizing signal and for providing it to the microprocessor 2", a character signal generator 17 for outputting a menu picture information of the selected automatic channel setting mode by said key input section 3" under the control of the microprocessor 2", and a mixer 18 for synthesizing the video signal detected from said video detecting section 7 and the menu picture information outputted from said character signal generator 10 and for displaying it on a screen.

A channel setting method by the system having the construction described above according to the present invention will be described hereinafter referring to FIG. 4–FIG. 8.

First, if a user inputs a menu key through the key input section 3", the microprocessor 2" controls the character signal generator 17 to constitute a menu picture as shown in FIG. 6A and output it on a screen through the mixer 11. In this case, if a user selects a set-up mode for automatical channel setting on said menu picture through the key input section 3", an automatic channel setting according to the present invention is accomplished.

If a channel setting mode is selected through this process, the microprocessor 2" controls the character signal generator 10 to constitute a menu picture as shown in FIG. 6B and output it on a screen through the mixer 11. A user can input a characteristic channel number corresponding the concerned broadcasting receiving district on the outputted screen through the key input section 3".

In this case, a district number catalog is promised in advance and stored in the memory(not shown) in the microprocessor 2", these numbers can be determined using telephone numbers or postal codes of the concerned district for users to easily recognize. If the number of the district is inputted, the microprocessor 2" searches the broadcasting channels and sets the searched broadcasting channels to plus channels. FIG. 7 shows an example of a table of broadcasting channels describing the broadcasting channel numbers received in the respective districts and the plus channel numbers with respect to the respective broadcasting stations.

Meanwhile, when the microprocessor 2" searches the broadcasting channels, the microprocessor 2" searches ±n numbers of channels neighboring the channel of the respective broadcasting station according to the researched district number as described above to prevent errors in searching channels. As an example, referring to FIG. 6B, in case the district number 05 is selected, this district is the district of Gyeongsangnam-Do province, the broadcasting channels of which is equal to the channels of Pusan, the broadcasting channel table of FIG. 7. When the channel of number 05 is searched, the channels of numbers 02, 03, 04, 05, 06, 07, and 08 including the neighboring channels are searched. By the same method, with respect to the channels of the numbers 07, 09, 36, 43, 13, 32, 10, and 46 also, ±3 numbers of neighboring channels are searched respectively. Therefore, to set the total of 9 broadcasting channels of Pusan, a total of 63 channels must be searched because a total of 7 channels including neighboring channels must be searched with respect to every channel (7×9=63). If all broadcasting channels being received in the district of Gyeongsangnam-Do are stored in the microprocessor 2" as described above, the microprocessor 2" decides which mode is selected between the automatic setting mode and the manual setting mode of the plus channel as shown in FIG. 5.

If the manual setting mode of the plus channel is selected, the channel setting is performed by manual handling of the key input section 3" as in the conventional method.

Meanwhile, if the automatic setting mode of the plus channel is selected, the microprocessor 2" defines any one channel x as a plus channel and searches this value x to map the first plus channel. That is, the microprocessor 2" compares the channel y automatically set as shown in FIG. 5 with a broadcasting channel -to-respective district table as shown in FIG. 7, and if a coinciding channel is searched, the microprocessor 2" compares the AGC value supplied to the analog/digital (A/D) input terminal of the microprocessor 2" when said channel y is selected with the AGC value when the channel x defined as a plus channel is selected.

That is, the broadcasting signal of a channel selected by the tuner 3 under the control of the microprocessor 2" is amplified at a pre-amplifier 12A of the amplifying section 12, and then the intermediate frequency of which is amplified at a IF amplifier 12B of the amplifying section 12, and then said signal is supplied to the image detecting section 14. And an image signal detected at said image detecting section 14 is outputted on a screen through the mixer 18, and supplied to the sync separating section 15. The sync signal separated at the sync separating section 15 and detected through the sync detecting section 16 is supplied to the microprocessor 2" and used for the signal of the character signal generator 17.

In this case, the AGC voltage A fed-back to the tuner 11 from the If amplifier 12B is inversely proportial to the electric field intensity which is the receiving sensitivity of the broadcasting signal of the channel selected as shown in FIG. 8, said AGC voltage is inversed by the inverter 6 and inputted into the microprocessor 2". The microprocessor 2" transforms digitally said AGC voltage A inputted as described above and compares it with the AGC value B defined as a plus channel.

If the compared result of the AGC values B, A (i.e., the inverted AGC value) of the respective channels x, y is B≥A, the automatically set channel is compared again with the broadcasting channel-to-respective district table and the AGC value A of the detected channel y is compared with the AGC value B of the plus channel x, and this process is repeated.

As a result of this repetitive comparing process, when the relation between the AGC values of the respective channels x, y is B<A, the detecting, comparing, and renewal of a plus channel x is repeated for said process to be completed with respect to all broadcasting channels in the broadcasting channel-to-respective district table till the plus channel having the best receiving sensibility is found out. If the plus channel x is searched by the method described above, the number of said channel is mapped for the plus channel.

As an example of the above process, a plus channel setting with respect to the KBS1 broadcasting of Pusan district in FIG. 7 will be described hereinafter.

KBS1 channels of Pusan district, searched in the automatic channel setting process of prior step, are three channels numbered 5, 7, and 9 as shown in the table of FIG. 7. Presume that the order of the reception quality of these three channels is number 5<number 7<number 9 and that the channel of x=1 is set for the initial value of a plus channel, the microprocessor 3' compares the automatically set channel with the KBS1 channels in said table.

As a result of the above comparison, because the channel of number 5 is in said table, it is selected for a searched channel y and the AGC value A of it is compared with the AGC value B of said plus channel x. The channel of number 1 is not a broadcasting channel, and the comparing result of AGC values in this case is A>B. Therefore, after the channel of number 5 becomes a plus channel by renewing the channel y having the AGC value A to a plus channel x, it is decided whether the comparing is completed.

Meanwhile, two channels of number 7 and number 9 are still left, and therefore the set channel is compared again with said table so that the channel of number 7 is found out for the automatically set channel y which is the next comparing object.

And then, the AGC value A of the channel y of number 7 is compared with the AGC value B of the channel of number 5 which is said plus channel, and the comparing result is B<A according to above presumption of the order of the receiving sensitivities of the channels of number 5, 7, and 9. Therefore, after the channel of number 7 becomes a plus channel by renewing the channel y having a AGC value A to a plus channel x, it is decided whether the comparison is completed.

Also, with respect to the channel of number 9 still left, the channel of number 9, which is the next object to be compared, is selected as described above by comparing again the set channel with said table. Comparing the AGC value A of the channel y of number 9 with the AGC value B of the channel of number 7 which is the plus channel, the comparing result is B<A according to above presumption of the order of the reception quality. Therefore, the channel of number 9 having a AGC value A is renewed to a plus channel x, and it is decided whether the comparison is completed, and then the channel of number 9, having the best reception quality, is set for the resultant plus channel according to the result of comparing the three KBS1 channels, thereby the automatic channel setting is completed.

As described above, according to the present invention, in an image broadcasting receiving device, convenience in use is provided because it is possible to set automatically a G-code broadcasting channel different according to the respective district, and a G-code reserved recording can be possible in the best reception state because it is possible to set a channel having the best reception quality to a plus channel. Further, because a producer or a salesman can be backed-up x already-set G-code broadcasting channel data through a separate device and use it for a channel setting of another VCR set, there is provided an advantage that a G-code channel setting by a user is not necessary.

While the present invention has been described and illustrated herein with reference to the preferred embodiment thereof, it will be understood by those skilled in the art that various changes in form and details may be made therein without departing from the spirit and scope of the invention.

What is claimed is:

1. An automatic broadcasting channel setting system comprising:

a tuner for selecting a channel of a received broadcasting signal;

a first key input means for inputting a key signal for automatic channel setting;

a first memory means for storing plus channel mapping data provided from an external memory; and a first microprocessor for setting a plus code channel in a concerned district among the received broadcast channels, storing said plus channel mapping data provided from said external memory in said first memory means and transmitting said plus channel mapping data stored in said memory means to said external memory according to said key signal from said key input means.

2. An automatic broadcasting channel setting system as claimed in claim 1, wherein said first microprocessor includes a table of broadcasting channels according to respective districts, said table of broadcasting channels being stored in a memory within said first microprocessor for use in setting a broadcasting channel to a plus channel.

3. An automatic broadcasting channel setting system comprising:

a first key input means for inputting a key signal for automatic channel setting;

a first microprocessor for searching and setting a broadcasting channel in a concerned district among the received channels according to the automatic channel setting key signal inputted from said first key input means, and for performing a controlling function to set said set broadcasting channel to a plus channel;

a first memory means for storing plus channel data set by said microprocessor, and for outputting said stored plus channel data under the control of said first microprocessor; and plus channel data back-up means for backing-up and storing the plus channel data which is set by said first microprocessor and stored in said first memory means, and for providing the stored plus channel data for a plus channel data of a receiver in which channel setting is not performed.

4. An automatic broadcasting channel setting system as claimed in claim 3, wherein said plus channel data back-up means comprises:

a second memory means for storing said plus channel data;

a second microprocessor for reading said plus channel data from said first memory means and storing it in said second memory means, or for reading said plus channel data stored in said second memory means and controlling to output it to said receiver in which channel setting is not performed yet; and second key inputting means connected to said second microprocessor for inputting a control key signal for controlling the recording and reading action of said second memory means.

5. An automatic broadcasting channel setting method comprising steps of:

selecting an automatic channel setting mode;

reading plus channel mapping data of a concerned district, said plus channel mapping data being stored in a memory of an external zig set, and storing the read plus channel mapping data in a memory of a video cassette recorder set; and setting a plus channel by matching the stored plus channel mapping data with automatic tuning data of a received broadcasting channel.

6. An automatic broadcasting channel setting method as claimed in claim 5, further comprising the step of transmitting said plus channel mapping data set, during said step of setting the plus channel, to said memory of said external zig set.

7. An automatic broadcasting channel setting method comprising steps of:

selecting an automatic channel setting mode;

searching and setting a broadcasting channel of a concerned district among various received broadcasting channels when the automatic channel setting mode is selected;

setting said set broadcasting channel to a plus channel;

backing-up and storing separately the channel data set in said plus channel setting step; and providing the backed-up and stored channel data for an image device in which channel setting is not performed.

* * * * *